(12) United States Patent
Sudo et al.

(10) Patent No.: US 9,416,463 B2
(45) Date of Patent: Aug. 16, 2016

(54) VITREOUS SILICA CRUCIBLE

(75) Inventors: Toshiaki Sudo, Akita (JP); Hiroshi Kishi, Akita (JP)

(73) Assignee: SUMCO CORPORATION, Tokyo (JP)

( * ) Notice: Subject to any disclaimer, the term of this patent is extended or adjusted under 35 U.S.C. 154(b) by 848 days.

(21) Appl. No.: 13/148,463

(22) PCT Filed: Dec. 13, 2010

(86) PCT No.: PCT/JP2010/072363
§ 371 (c)(1),
(2), (4) Date: Aug. 8, 2011

(87) PCT Pub. No.: WO2011/071178
PCT Pub. Date: Jun. 16, 2011

(65) Prior Publication Data
US 2012/0125257 A1  May 24, 2012

(30) Foreign Application Priority Data

Dec. 11, 2009  (JP) ................................. 2009-282082

(51) Int. Cl.
C30B 35/00 (2006.01)
C30B 15/10 (2006.01)
C03B 19/09 (2006.01)

(52) U.S. Cl.
CPC ............... C30B 15/10 (2013.01); C03B 19/095 (2013.01); C30B 35/002 (2013.01); *Y02P 40/57* (2015.11); *Y10T 117/1032* (2015.01)

(58) Field of Classification Search
CPC ...... C30B 15/10; C30B 35/002; Y10T 117/10
USPC ....... 65/60.1, 60.5, 63; 117/200, 900
See application file for complete search history.

(56) References Cited

U.S. PATENT DOCUMENTS

| | | | |
|---|---|---|---|
| 6,548,131 B1 * | 4/2003 | Fabian et al. | 428/34.4 |
| 2005/0263062 A1 * | 12/2005 | Hoshi et al. | 117/13 |
| 2009/0151624 A1 * | 6/2009 | Shimazu | 117/208 |
| 2010/0162760 A1 | 7/2010 | Fujita et al. | |

FOREIGN PATENT DOCUMENTS

| | | |
|---|---|---|
| JP | 02-180788 A | 7/1990 |
| JP | 03-081368 U | 8/1991 |
| JP | 06-239632 A | 8/1994 |
| JP | 10-072276 A | 3/1998 |
| JP | 10-120486 A | 5/1998 |

(Continued)

OTHER PUBLICATIONS

Patent Abstracts of Japam, English Abstract and computer translation of JP 2008-273788 (2014).*
Extended European Search Report (EESR) mailed May 23, 2012, issued in corresponding Application No. EP10836097.5.
Japanese Office Action that issued with respect to counterpart Japanese Patent Application No. 2011-545276, mailed Jul. 10, 2012.

(Continued)

*Primary Examiner* — Matthew Song
(74) *Attorney, Agent, or Firm* — Law Office of Katsuhiro Arai

(57) ABSTRACT

Provided is a vitreous silica crucible having a reference point, which is capable of accurately detecting the location of a defect in the vitreous silica crucible used for pulling silicon single crystal, determining a defect generating site of silicon single crystal, and investigating the cause of the defect. The reference point used for specifying the position relationship with respect to a particular part is formed in at least one site of an end portion, an inner wall and an outer wall of the crucible.

4 Claims, 4 Drawing Sheets

(56) References Cited

FOREIGN PATENT DOCUMENTS

| | | | | |
|---|---|---|---|---|
| JP | 11-209136 A | 8/1999 | | |
| JP | 11-228283 A | 8/1999 | | |
| JP | 2005-272178 A | 10/2005 | | |
| JP | 2008-195601 A | 8/2008 | | |
| JP | 2008273788 A | * 11/2008 | .............. | C30B 29/06 |
| WO | 2009/017071 A | 2/2009 | | |

OTHER PUBLICATIONS

Chinese Office Action issued by Chinese Patent Office, mailed Jul. 22, 2013, for Chinese counterpart application No. 2010800082707.

International Search Report for PCT/JP2010/072363 (mailing date: Feb. 8, 2011).

* cited by examiner

| PRODUCT NAME | | CRUCIBLE A | CRUCIBLE B |
|---|---|---|---|
| DEPTH OF DEFECT | COORDINATE OF BUBBLE(X,Y,Z) | 153,231,135 | 131,542,565 |
| | DISTANCE FROM INNER SURFACE OF CRUCIBLE TO DEFECT (um) | 1045 | 964 |
| USE ENVIRONMENT | TEMPERATURE OF SILICON MELT(°C) | 1500 | 1500 |
| | ATMOSPHERE (kPa) | 6.67 | 6.67 |
| | MELTING RATE OF VITREOUS SILICA (um/h) | 15 | 15 |
| | IMMERSING TIME OF BUBBLE (h) | 100 | 34 |
| | REDUCED THICKNESS OF VITREOUS SILICA (um) | 1500 | 510 |

| EXPOSURE TIME TO BE SCHEDULED [TIME FROM INITIATION OF IMMERSING] | 69.6 | NO POSSIBILITY OF EXPOSURE |
|---|---|---|

COORDINATE IS (1/100mm)

Fig. 5

VITREOUS SILICA CRUCIBLE

CROSS-REFERENCE TO RELATED APPLICATIONS

This application is the U.S. National Phase under 35 U.S.C. §371 of International Application PCT/JP2010/072363, filed Dec. 13, 2010, which claims priority to Japanese Patent Application No. 2009-282082, filed Dec. 11, 2009.

TECHNICAL FIELD

The present invention relates to a vitreous silica crucible for pulling silicon single crystals.

BACKGROUND ART

In the manufacturing of semiconductor devices, etc., used in electronics technologies leading information society, silicon wafers may not be omitted. Characteristics of silicon wafers include micro defects such as oxygen precipitate, dislocation, oxygen stacking faults and the like. Micro defects are advantageous for capturing heavy metal pollution that occurs in a device process, but may become a source of device failure. Therefore, there may be a need to adjust the oxygen concentration in a crystal to a predetermined concentration corresponding to types of devices or device processes used.

As a current method of manufacturing silicon single crystals, the "Czochralski method" (hereinafter referred to as "CZ method") of manufacturing silicon single crystals through pulling is generally used. In addition, there is a method called the magnetic field applied Czochralski method (MCZ method) which is a CZ method performed under a strong magnetic field.

In the CZ method, a polycrystal silicon that is highly purified with a metal impurity concentration of a few ppb (parts-per-billion, 1 ppb=$10^{-9}$) or less is generally put into a high-purity vitreous silica crucible together with a resistivity control dopant (e.g., boron (B) or phosphorous (P)) and is melted at a temperature of about 1,420 deg. C. Continuously, a seed crystal silicon rod is brought into contact with a surface of silicon melt, the seed crystal or the vitreous silica crucible is rotated to make the seed crystal thin (dislocation-free) and then the seed crystal is pulled up, thereby enabling a silicon single crystal ingot having the same atomic structure as the seed crystal to be obtained.

As aforementioned, the vitreous silica crucible is a container to put silicon melt therein when pulling molten polycrystalline silicon into a single crystal. Vitreous silica is progressively molten into the silicon melt. For this reason, the vitreous silica crucible, as described above, serves as an oxygen source supplying oxygen to a silicon wafer when pulling the single crystal, and also serves as an impurity source supplying trace impurities such as Fe, Al and Na. Furthermore, defects contained in the vitreous silica(silica glass) are also melted and mixed into the silicon melt. Representative defects include bubbles with $\phi 0.05$ mm or more in diameter and metal pieces such as iron pieces.

During the pulling of single crystal silicon by CZ method, if bubbles with $\phi 0.05$ mm or more in diameter are exposed or burst, broken small pieces of vitreous silica drop into the silicon melt. The pieces of vitreous silica move by the heat convection of the silicon melt, and adhere to a silicon single crystal. This causes silicon single crystal to be polycrystallized, thereby resulting in a decrease in yield of single crystal. Moreover, gases in the bubble are also mixed into the silicon melt. In the case where these gases are introduced into a silicon single crystal, they become defects of the silicon single crystal. Impurities such as iron which are contained in the vitreous silica cause O—Si—O bonds of the vitreous silica to be broken and transferred to a stable crystal (β-cristobalite) at a single crystal growing temperature, and thus a peripheral region around the metal pieces are crystallized. Since this crystal is peeled off when exposed to the silicon melt, it is mixed into the silicon melt like bubbles, leading to a decrease in yield of single crystal. Recently, accompanied with the tendency for implementing crucibles having large diameter (700 mm or more), a single crystal growing temperature becomes higher in the case of performing CZ method using a vitreous silica crucible, and therefore vitreous silica tends to be melted faster than before. Also, the manufacturing time of single crystal by CZ method is made longer to thereby increase the molten amount of vitreous silica, and thus the above-described problems becomes more serious.

Although having absolutely different objectives from that of the present invention, a related art technology of providing a mark at a vitreous silica crucible, for example, a technology of installing a detachable_mark member to the crucible is disclosed in Patent Document 1 below.

PRIOR ART REFERENCE

Patent Document

Patent Document 1: Japanese Patent Application Laid-Open Hei. No. 10-120486

SUMMARY OF THE INVENTION

Problems to be Solved by the Inventions

However, the related art technology can be improved in consideration of below-described points.

First, since defects in the vitreous silica crucible have an adverse effect when exposed to a silicon melt, it is desirable to monitor a distance from the inner surface of the vitreous silica crucible to the defects. Herein, there is the relationship between the distance to the corresponding defect and the duration of the defect to be immersed in the the silicon melt (that is, the molten amount of a sidewall of the vitreous silica crucible). This is because the immersing time and molten amount may vary depending on the part of the vitreous silica crucible. Furthermore, since the height of the melt surface of the silicon melt is lowered as a single crystal is pulled, the immersing time and molten amount are likely to be increased from a straight body portion toward a bottom portion of the vitreous silica crucible. Therefore, if information for a defect existing in the vitreous silica crucible, for example, height, location and distance from the inner surface is accurately detected, the distance from the inner surface of the vitreous silica crucible to the defect may be monitored. However, the related art vitreous silica crucible is problematic in that it is difficult to detect the distance from the inner surface of the vitreous silica crucible to the defect and also difficult to find out a solution to determine product shipment or several inconveniences.

Second, in Patent Document 1, the mark member is merely used for adjusting positions in each process at every conveyance in the manufacturing of a vitreous silica crucible. Specifically, in Patent Document 1, the detachable mark member is used during relative movement, and then removed before a fusing process of raw materials and a bulk pulling process. For this reason, by use of the detachable mark member, it is difficult to monitor the distance from the inner surface of the vitreous silica crucible to defects during the manufacturing of silicon single crystal by CZ method.

The present invention is hereby devised in consideration of the above-described phenomena, and the objective of the present invention is to provide a vitreous silica crucible having a reference point, which is capable of expressing the location of a defect in the crucible as a numeric value by using a certain standard and also determining whether the defect is problematic or not based on the defect location information expressed as the numeric value during the pulling of single crystal silicon.

Means for Solving the Problems

The summarized configurations of the present invention are as follows.

(1) A vitreous silica crucible including: a cylindrical straight body portion having an edge portion of which an upper end is open; a mortar-shaped bottom portion; and a corner section connecting the straight body portion and the bottom portion, wherein a fixed reference point for use in specifying a position relationship with a particular part is provided on at least one site of the edge portion and the inner and outer walls of the vitreous silica crucible.

(2) The vitreous silica crucible described in the above (1), wherein the reference point formed on the inner wall and/or outer wall is provided within an area including the edge portion of the straight body portion and a region from the edge portion to 15 cm below the edge portion.

(3) The vitreous silica crucible of the above (1), wherein the reference point is convex or concave.

(4) The vitreous silica crucible of the above (1), wherein the reference point has the shape of a circle of which a diameter is in the range of 0.5 mm to 10 mm.

(5) The vitreous silica crucible of the above (1), wherein the reference point is a laser mark.

(6) The vitreous silica crucible of claim (1), wherein the reference point is a transcription mark from a mold made of carbon.

Effect of the Invention

According to the present invention, it is possible to accurately detect the height position of a defect existing inside the vitreous silica crucible, and the distance from the inner surface of the vitreous silica crucible. Also, in the case where the vitreous silica crucible according to the present invention is used for pulling a single crystal silicon, information for a defect location has been already known accurately, thereby making it possible to prevent the occurrence of defective products of single crystal by properly setting the upper limit of an immersing time of the vitreous silica crucible in the silicon melt in order for defects not to be exposed.

BRIEF DESCRIPTION OF THE DRAWINGS

FIG. 5 is a table showing evaluation results of bubble defects in a crucible.

DESCRIPTION OF THE EMBODIMENTS

Figure 1:
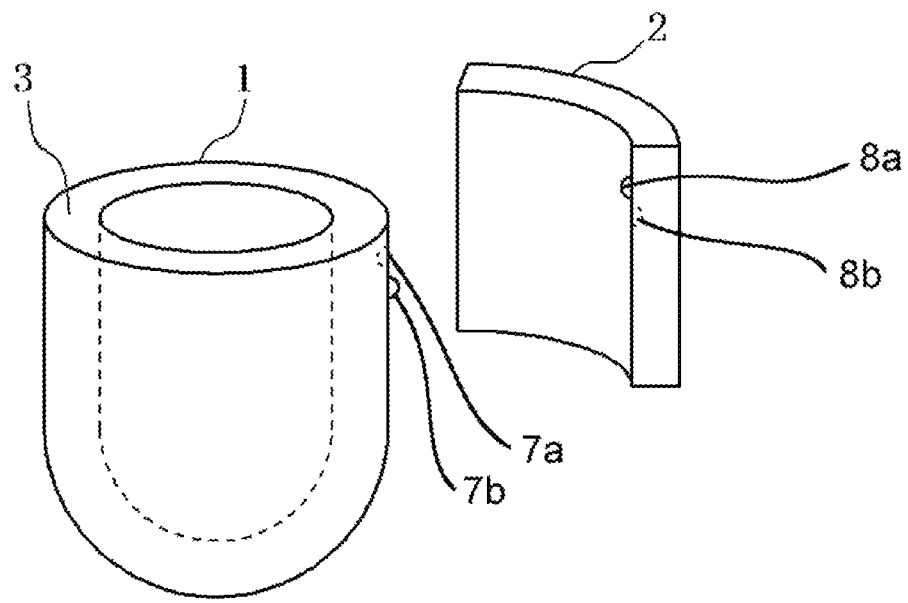
FIG. 1 is a schematic view illustrating a mold and a crucible.

Hereinafter, exemplary embodiments will be described in detail with reference to the accompanying drawings. Like reference numerals in the drawings denote like elements, and thus their description will be omitted.

FIG. 1 is a schematic view illustrating a mold and a crucible. Although a vitreous silica crucible 1 used in the current exemplary embodiment may be appropriately used as any one of well-known conventional vitreous silica crucibles 1 used for single-crystal growing by CZ process, the vitreous silica crucible 1 may be more suitably used for a large-diameter crucible with 800 mm or more in diameter which may be susceptible to defects.

In the current exemplary embodiment, as illustrated in FIG. 1, a fixed reference point used for specifying position relationship with a particular part (bubble generating locations, etc.) may be provided on at least an outer wall of the vitreous silica crucible 1. The accurate location of defects may be 3-dimensionally figured out by the fixed reference point. Also, in the drawings, reference numeral 1 denotes a vitreous silica crucible, reference 2 denotes a carbon mold, and reference numeral 3 denotes an edge portion of the crucible having an opening(open circumferential portion). Herein, the edge portion 3 (including an end surface) and an area from the edge portion to 15 cm below the edge portion are suitable for the installation position of the fixed reference point in the current exemplary embodiment. When the fixed reference point is formed on the outer wall of the vitreous silica crucible 1, the reference point may be provided by, for example, a mold 2 used in manufacturing the vitreous silica crucible 1. The mold 2 is a container made of carbon which corresponds to a cast mold used for manufacturing a casting product. Typically, silica powder used as a raw material for the vitreous silica crucible 1 are supplied to a wall of the mold 2 from an upper portion thereof, and filled into the entire wall of the mold 2 made of carbon. Thereafter, a predetermined thickness is formed by a centrifugal force by the rotation of the mold 2, and the vitreous silica crucible 1 is formed by performing arc fusing from the inside thereof.

In the present invention, in the case where a transcription mark obtained by the carbon mold is formed on the vitreous silica crucible, a concave and/or convex portion for transcription mark is prepared in the carbon mold in advance. The preparation method of the concave and/or convex portion is not particularly limited. However, in the case where, for example, a concave portion is formed on the mold, the concave portion may be prepared by processing with a drill made of high-speed steel. In the case of forming a convex portion on the mold, the convex portion for the transcription mark can be formed by providing a concave portion on a mold for manufacturing the mold. By virtue of the reference point formed by transcription from the mold, it is possible to accurately figure out the position relationship between the crucible and the mold for molding. At this time, the number and position of the reference point may be appropriately selected considering the used condition of the crucible.

Also, in the case where a convex portion is formed on the mold, the size (height) of the convex portion may be determined in consideration of a layer thickness of undissolved silica powder existing between the vitreous silica crucible and the carbon mold. For example, the height of the convex portion may be in the range of 2 mm to 15 mm. That is, as long as the height of the convex portion falls into the above-described range, the vitreous silica crucible can be smoothly taken out without being broken when the manufacturing process of the vitreous silica crucible is finished and the vitreous silica crucible is taken out from the mold.

The reference point which serves as a reference in space coordinates may have a circle- or line-shaped concave or convex portion, and any reference point may be formed at a predetermined site. Directly after the vitreous silica crucible is manufactured by arc fusing, a part (not shown) which is called a rim edge part remains in an upper region of the opened edge portion 3 of the crucible of FIG. 1. This is removed during the subsequent process, and resultantly the vitreous silica crucible has the shape in FIG. 1. For this reason, in the case of trying to form the reference point near the rim edge part, the reference point should be formed in consideration of this fact. Also, the reference point may have a mixed or combined shape in which various shapes such as concave portions or convex portions are mixed or combined.

Figure 2:
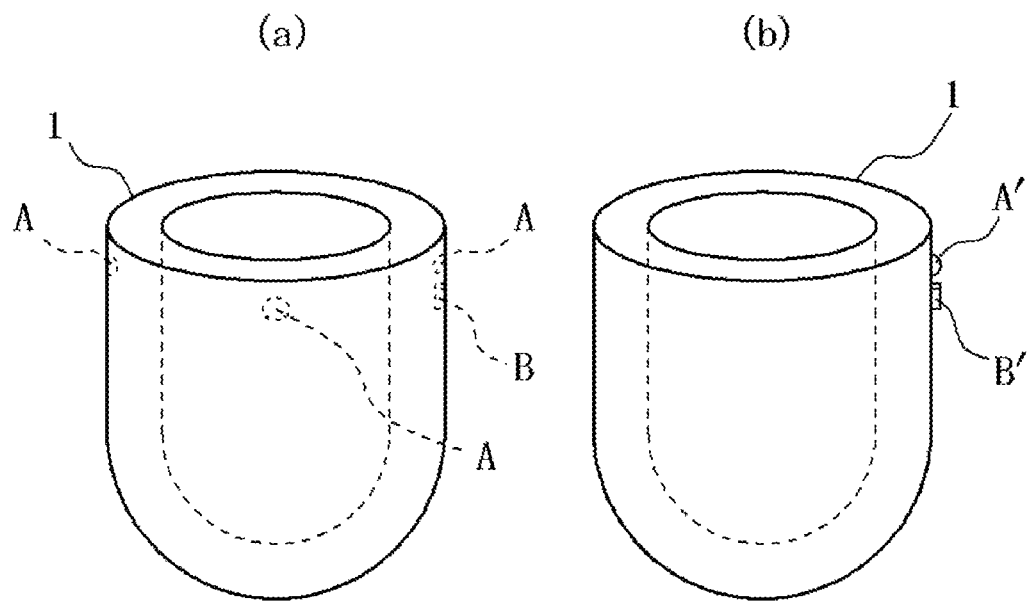
FIG. 2 is a schematic view illustrating a circle- or line-shaped reference point.

FIG. 2 is a schematic view illustrating a desirable status of the reference point. FIG. 2(a) illustrates the reference point having the shape of a circle- or line-shaped concave portion, and FIG. 2(b) illustrates the reference point having the shape of a circle- or line-shaped convex portion.

In case of the circular reference point (A) illustrated in FIG. 2(a), it is appropriate that the circular reference point (A) has a diameter ranging from about 0.5 mm to about 10 mm and a depth ranging from about 2 mm to about 15 mm. If the diameter and depth are less than the lower limit, the reference point may disappear during the pulling of single crystal silicon; however, if the diameter and depth are greater than the upper limit, the reference point may act as a defect of the crucible. In the case where the reference point B is line-shaped, the reference point may have the length of about 10 mm to about 100 mm, the depth of about 2 mm to about 15 mm, and the width of about 0.5 mm to about 10 mm, and an area from the edge portion (including an end surface) up to 15 cm below the edge portion of the crucible of FIG. 1 is suitable for a reference point forming region.

The reference point having the shape of a convex portion shown in FIG. 2(b) is opposite to the shape in FIG. 2, and, like the dimension of the concave portion, it is appropriate that the circle-shaped reference point A' may have a diameter ranging from about 0.5 mm to about 10 mm, and the depth ranging from about 2 mm to about 15 mm. In addition, the line-shaped reference point B' may have the length of about 10 mm to about 100 mm, the depth of about 2 mm to about 15 mm, and the width of about 0.5 mm to about 10 mm. Also, as the same as the concave reference point, an area from the edge portion (including an end portion) to 15 cm below the edge portion of the crucible of FIG. 1 is suitable for a convex portion forming region.

An example of usage of a reference point provided on a vitreous silica crucible according to the present invention will be described as follows, using a circular concave shaped reference point shown in FIG. 2(a). For example, when the position of the vitreous silica crucible is determined by use of a surface plane and the reference point, the reference point according to the present invention can be any one of the plurality of reference points (A) shown in FIG. 2(a) by positioning the vitreous silica crucible at the surface plate having a groove corresponding to its bottom shape to secure the center axis. In addition, when the surface plate is not used, it is preferable to provide two or more reference points (A) as shown in FIG. 2(a), and in particular, it is preferable to provide a reference point to obtain a datum (in theoretically correct geometric reference) plane, in consideration of the applicability of a measurement method described as follows. In addition, the datum plane refers to a datum plane described in Japan Industrial Standard (JIS) B 0022.

If one or more of the reference points are used, a generation region of bubbles and the like may be accurately measured by a 3D measuring device. All conventional measuring devices may be used as the 3D measuring device. As a measuring method, it is appropriate to align a sensor of the 3D measuring device to a plurality of reference points and only to move and fix the position of a crucible to align a datum plane obtained by a least squares method and the like from a predetermined datum plane and the plurality of reference points of the crucible. Further, any of an optical sensor, a laser probe, a touch probe, and the like may be appropriately used as the sensor of the 3D measuring device.

A vitreous silica crucible may be always installed at the same position by the above-described method, and as a result, the same coordinate indicates the same position in any crucible. That is, data of the coordinates may be exchanged between different processes, such as the inspection process of a vitreous silica crucible and the pulling process of silicon single crystals. This enables countermeasures, such as changes in manufacturing conditions during the pulling by setting, depending on the defect positions of the vitreous silica crucible, the upper limit of the time during which vitreous silica is immersed in the silicon so as not to expose defects of the vitreous silica crucible.

Defects of the vitreous silica crucible described in the present invention are, for example, metal pieces of Fe or Al, bubble defects, and the like. When there are bubble defects or the like, silicon single crystals are polycrystallized during the pulling stage of silicon single crystals and therefore it is preferable to reduce the bubble defects or the like.

Figure 3:
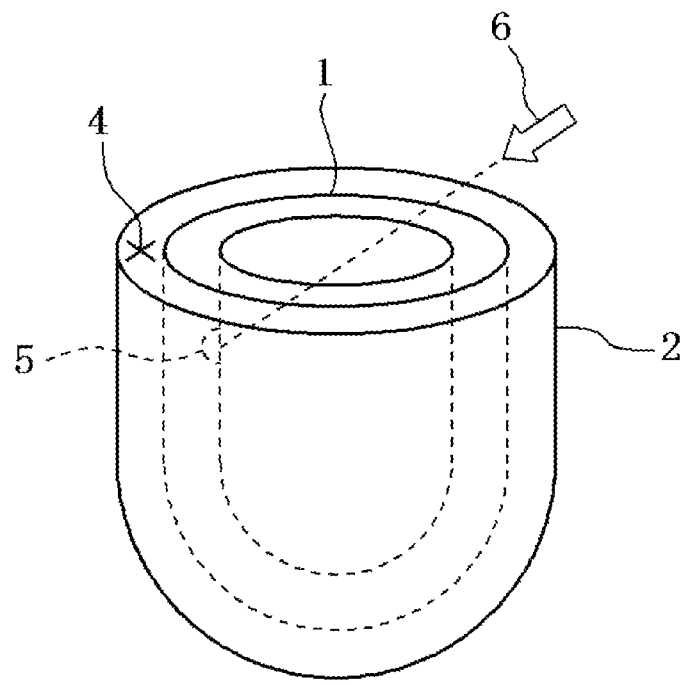
FIG. 3 is a schematic view illustrating a crucible with a laser mark provided.

So far, although the reference point is formed by transcribing a convex or concave portion provided on a mold to a crucible, the reference point may be formed by using laser, which will be described below. FIG. 3 schematically illustrates a laser mark provided according to the present invention. In the drawing, reference numeral 4 is a mark on the mold, reference numeral 5 is a laser mark, and reference numeral 6 is a direction to which laser light is released. When the reference point is formed by using laser, a laser mark may be always given at the same position based on a mark provided at a mold during the existence of a crucible inside the mold after manufacture of the crucible, as shown in FIG. 3. For this reason, the reference point according to the present invention may be formed on an inner wall as well as an outer wall of the vitreous silica crucible. In addition, considering the accuracy of shape and position, a CO2 gas laser method is particularly advantageous for a means for forming a laser mark.

In addition, it is possible to accurately find out the location of the defect of the carbon mold, by correlating the vitreous silica crucible with the carbon mold, as described below.

Furthermore, the reference point may be provided on the edge portion of the opening of a vitreous silica crucible, that is, on the top surface of the crucible. In this case, a defect location may be simply identified, for example, by forming the reference point at a position just above the defect area detected by a test. In the present invention, the reference point forming method is not limited to transcription marks by the carbon mold or laser marking, and thus, conventional well known processing methods performed on vitreous silica, e.g., drilling may be applied as a means of providing a reference point as long as a reference point may be given to silica.

Moreover, the shape of the reference point is identical to that provided on the mold. Thus, in the case of a circle-shaped reference point, it is appropriate that the diameter is in the range of about 0.5 mm to about 10 mm and the depth is in the range of about 2 mm to about 15 mm. An area from the upper end (including an end portion) to 15 cm below the upper end is appropriately used as the reference point forming region, as shown in FIG. 1. In the case of a line-shaped reference point, it is appropriate that the line-shaped reference point has a length of about 10 mm to about 100 mm, a depth of about 2 mm to about 15 mm, and a width of about 0.5 mm to about 10 mm. Like the circular reference point, an area from the upper end (including an end portion) to 15 cm below the upper end is appropriately used as the reference point forming region, as shown in FIG. 1.

For example, when a CO2 gas laser method is used, a 3-axis control laser marker may be used as a laser device. A focal distance of the laser device is variable as long as the height of the area irradiated is in a range of about 42 mm.

Thus, the laser device allows an inclined plane or curved plane to be marked without fine-tuning of the distance or levelness between the device and an irradiated object.

The sequence of processing a reference point by CO2 gas laser is as follows:
1. Process of loading a crucible on a bottom plate having an opening for marking at a center thereof with a three jaw scroll chuck tool for determining a central position of the crucible in a state that the opening of the crucible is directed downward;
2. Process of determining the central position of the crucible with the three-jaw scroll chuck tool;
3. Process of elevating a laser processor to an inner wall of the crucible;
4. Process of controlling a distance between the inner wall of the crucible and a laser irradiation hole with a red semiconductor laser having a wavelength of 650 nm which is built in a laser apparatus;
5. Process of providing a reference point with the laser processor;
6. Process of rotating the bottom plate having a servo controller and providing a second reference point by laser; and
7. Process of returning the laser processor to the original position.

In the present invention, an area from an end portion of an opening (including upper end surface) to about 15 cm below the end portion is appropriately used as a reference point forming region. This is because a part where the reference point is below the silicon melt surface is pressed by a carbon susceptor during the pulling process of silicon single crystals due to the weight of silicon melt, and thus the reference point may disappear if the point is present in the outer wall to be pressed. In the case where the reference point is present on the inner surface below the silicon melt surface, vitreous silica is melted into the silicon melt and therefore the reference point may also disappear.

In a vitreous silica crucible according to the present invention to which a reference point is added, it is possible to estimate whether defects may be caused in the single crystal silicon during the pulling process of single crystal silicon. The estimation sequence includes: finding out the height position of a defect and the distance from an inner surface; and comparing the reduced thickness of vitreous silica, which may be calculated from pulling conditions and immersion time in the conditions. Specifically, under conditions including the temperature of the silicon melt of 1500 deg. C. and the ambient pressure (Ar) of 6.67 kPa, the melting rate of vitreous silica is about 15 µm/h, and thus the reduced thickness of glass in the height where there are defects may be somewhat calculated from the melting rate and immersion time. When the calculated reduced thickness and the distance of the defect from the inner surface are compared with each other, the possibility that the defects are exposed can be estimated.

EXAMPLE

Example 1

Figure 4:
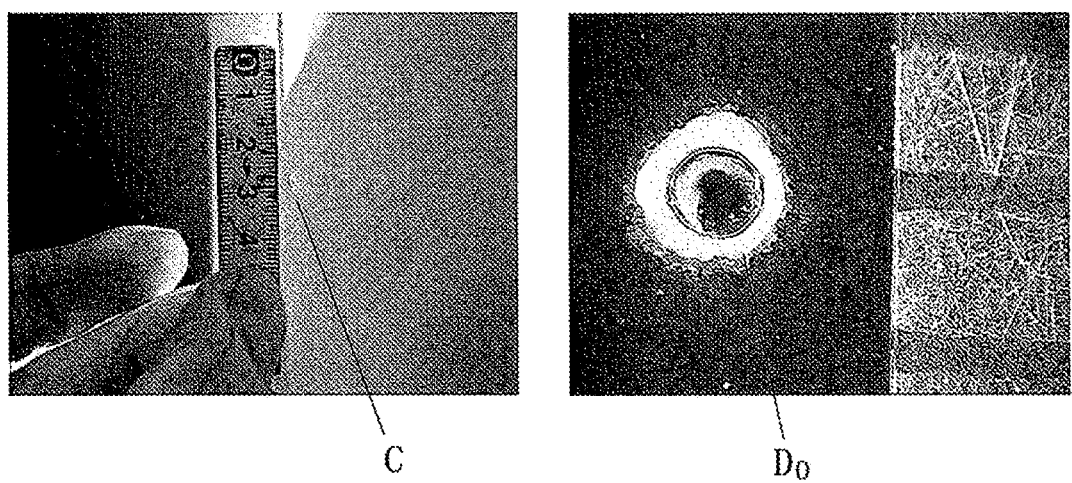
FIG. 4 is an image showing a reference point.

Reference point 'C' made by means for providing a convex portion in advance in an inner wall of a carbon mold and reference 'D0' made by a process of a $CO_2$ gas laser were formed in a vitreous silica crucible with 800 mm in diameter. Results of formation of reference points are respectively shown in images of FIG. 4. From FIG. 4, it can be seen that the reference points were formed. Also, the reference points were 5 mm in diameter and positioned 10 cm below an edge of the crucible.

Further, in the present embodiment, processing conditions by the $CO_2$ gas laser are as follows.
Irradiation laser: CO2 laser (Class 4)
Irradiation laser mean-output: 30 W
Oscillation wavelength range of irradiation laser: 10.6 µm
Irradiation method: XYZ 3-axis simultaneous scanning method
Processing space: 300×300×42 mm Like the reference point 'D0', reference points D1 and D2 (total three reference points) were formed in the vitreous silica crucible. Measurement results are shown below. (Unit: 1/100 mm)
C(X, Y, Z): (152.023, 145.445, 400.313)
D0(X, Y, Z): (150.413, 132.560, 421.432)
D1(X, Y, Z): (150.413, 550.235, 421.432)
D2(X, Y, Z): (434.341, 132.560, 421.432)

The vitreous silica crucible which is a target to be measured was placed at a predetermined position for measurement by using these reference points. Next, light (Xenon lamp) was passed through the vitreous silica crucible as a method for confirming scattering due to bubbles to confirm a position of bubble defect of 50 µm or more in diameter, and the position of the bubble defect was measured by a three-dimensional measuring instrument. A handy type non-contact shape measurement system was used as the three dimensional measuring instrument. Also, while in the description of the present disclosure, a circular hole formed by the $CO_2$ gas laser is used as the reference point 'D0', it was confirmed that if reference points in accordance with the present invention, such as a reference point having a shape other than the circular shape, a reference point formed at an end portion by the $CO_2$ gas laser, a reference point formed by means for providing a convex portion in advance on an inner wall of a mold and the like, are used, the same result is obtained.

The specification of the three dimensional measuring instrument is as follows.
Measurement range . . . X: 850 mm Y: 700 mm Z: 600 mm
Measurement accuracy: X, Y, Z axis $U1 \leq (0.5 \pm L/900)$
Space axis . . . $U3(0.8 \pm L/600)$
(U1, U3: µm) (L=measurement length: mm)

As aforementioned, while the position determining sequence of the vitreous silica crucible in the current test may be performed by using a datum plane, the position determining sequence in the current test was determined by using the aforementioned surface plate+reference points. The vitreous silica crucible was fixed at a predetermined position by using the surface plate+reference points. Thereafter, a bubble defect position was measured by using the three dimensional measuring instrument. Measuring results are shown in FIG. 5.

Among the vitreous silica crucibles which were subject to the bubble defect position measurement, the vitreous silica crucible 'A' in which a bubble defect was perceived at a position affecting generation of a defect in a silicon single crystal, and the vitreous silica crucible B in which a bubble was not perceived at a position affecting generation of a defect in a silicon single crystal were loaded in a CZ furnace, a polycrystalline silicon lump was put in each of the vitreous silica crucibles, the CZ furnace was maintained in an argon gas atmosphere (6.67 kPa) and was elevated in temperature from room temperature (20 deg. C.) to 1500 deg. C. over 10 hours, the elevated temperature was maintained for a predetermined time to melt the polycrystalline silicon lump and thus form silicon melt. A seed crystal was immersed in the silicon melt and then gradually pulled while rotating the crucible, to grow a silicon single crystal.

Figure 6:
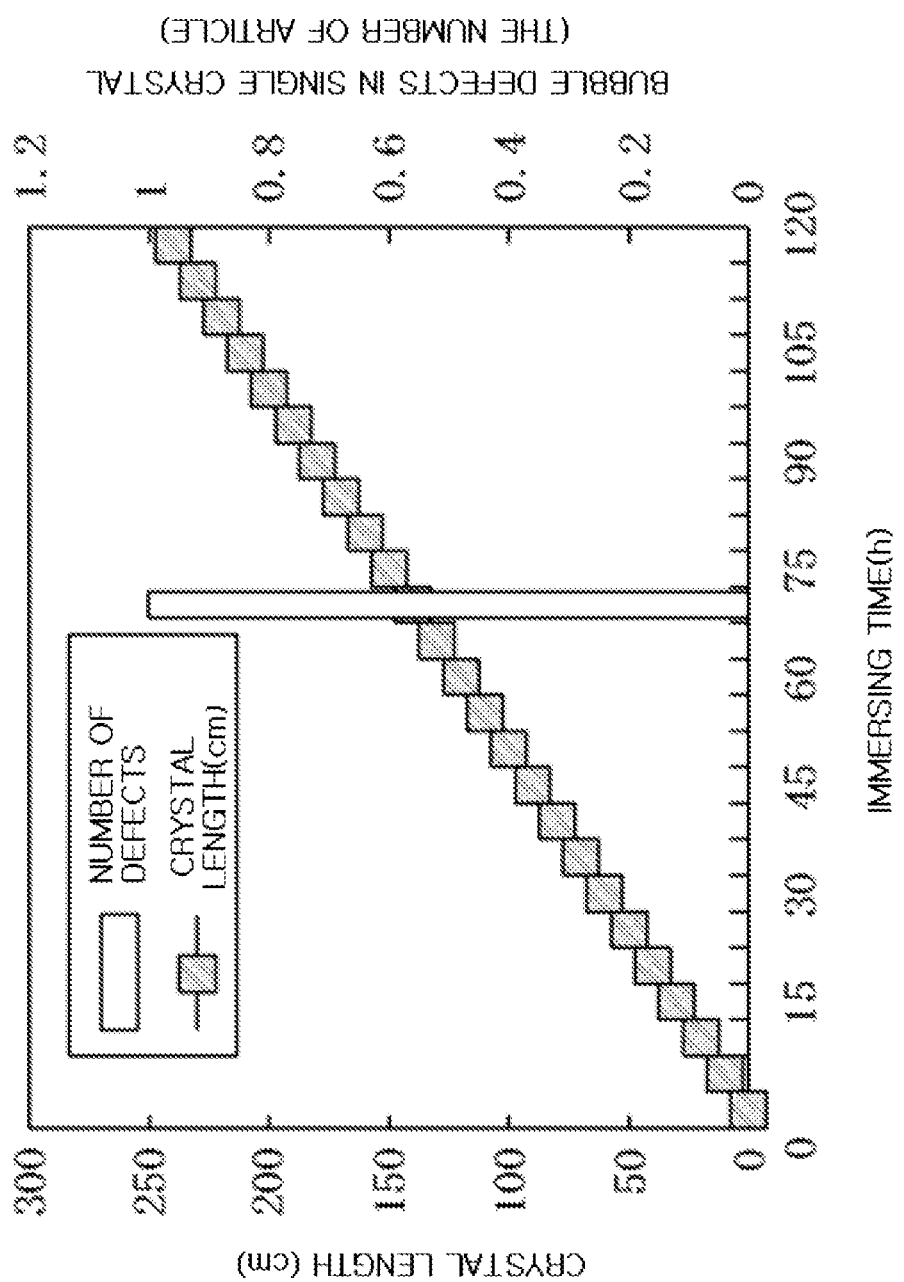
FIG. 6 is a graph showing bubble locations in a single crystal which is pulled up.

A defect generation portion in the silicon single crystal was estimated from the defect position data of the vitreous silica crucible 'A'. From the estimated information, a defect generation circumstance when the estimated portion of a wafer was actually cut was compared with a defect generation circumstance in the wafer at the front and rear portions of the estimated portion. Comparing results are shown in FIG. 6. The defect measurement was performed by polishing the cut wafer with a mixing solution of a chemical component having a chemical polishing action and particles having a mechanical polishing action, and measuring the number of defects (LPD of polished surface >0.065 µm) with a laser surface inspection machine. From the results of FIG. 6, it can be seen that a defect generation rate in a specific portion of the wafer is higher than the defect generation rate in other portions of the wafer. That is, it can be seen that a defect generation can be estimated very accurately.

Meanwhile, a silicon single crystal was manufactured according to the foregoing pulling condition by using the vitreous silica crucible B' to obtain a wafer, the wafer was cut, and a defect generation in the cut wafer was inspected in the foregoing sequence. As a result of the inspection, there was no defect generating region.

INDUSTRIAL APPLICABILITY

Since the present invention can accurately detect the position relationship between the crucible and the mold used for the crucible, the present invention is helpful in specifying a defect generation portion due to the crucible and investigating causes of defect generation. Also, in the case where the crucible in accordance with the present invention is used in pulling a silicon single crystal, since various countermeasures, such as avoiding use of the crucible and the like can be planned by the position information of a defect and the like, the present invention contributes to defect generation prevention and enhancement in yield of a silicon single crystal ingot.

EXPLANATION OF REFERENCE SYMBOLS

1 vitreous silica crucible
2 carbon-made mold
3 edge portion of a crucible having an opening
4 mark on a mold
5 laser mark
6 direction to which laser light is released

The invention claimed is:

1. A vitreous silica crucible for accommodating silicon melt while pulling molten silicon into a single crystal, comprising:
   a cylindrical straight body portion having an edge portion, an upper end of which is open;
   a mortar-shaped bottom portion; and
   a corner section connecting the straight body portion and the bottom portion,
   wherein one fixed reference point is provided on a surface of the vitreous silica crucible within an upper area including the edge portion of the straight body portion and a region from the edge portion to 15 cm below the edge portion, wherein the fixed reference point is concave or convex having a depth or height of 2 to 15 mm and having a diameter of 0.5 mm to 10 mm, said fixed reference point being usable for defining a datum plane defined in Japan Industrial Standard (JIS) B 0022,
   wherein the one reference point is all concave and convex points having a depth or height of 2 to 15 mm and having a diameter of 0.5 mm to 10 mm provided within the upper area of the vitreous silica crucible.

2. The vitreous silica crucible of claim 1, wherein the reference point is a laser mark.

3. The vitreous silica crucible of claim 1, wherein the reference point is a transcription mark from a mold made of carbon.

4. The vitreous silica crucible of claim 1, wherein the crucible has an opening diameter of 800 mm or more, and the fixed reference point is located above an initial silicon melt surface.

* * * * *